(12) United States Patent
Bowen et al.

(10) Patent No.: US 6,881,965 B2
(45) Date of Patent: Apr. 19, 2005

(54) MULTI-FOIL OPTIC

(75) Inventors: David Keith Bowen, Warwick (GB); Ladislav Pina, Praha (CZ); Adolf Inneman, Praha (CZ); Rene Hudec, Praha (CA); Stephan Menzer, West Yorkshire (GB)

(73) Assignee: Bede Scientific Instruments Ltd., Durham (GB)

( * ) Notice: Subject to any disclaimer, the term of this patent is extended or adjusted under 35 U.S.C. 154(b) by 0 days.

(21) Appl. No.: 10/627,863

(22) Filed: Jul. 28, 2003

(65) Prior Publication Data

US 2004/0089818 A1 May 13, 2004

Related U.S. Application Data

(60) Provisional application No. 60/398,599, filed on Jul. 26, 2002.

(51) Int. Cl.[7] .................................................. G21K 5/04
(52) U.S. Cl. ............................... 250/492.2; 250/505.1; 378/34
(58) Field of Search .......................... 250/492.2, 492.1, 250/492.3, 505.1, 370.08, 370.09; 378/84, 85, 71, 70, 34

(56) References Cited

U.S. PATENT DOCUMENTS

| | | | |
|---|---|---|---|
| 4,856,043 A | 8/1989 | Zola | |
| 5,373,544 A | 12/1994 | Goebel | |
| 6,226,120 B1 * | 5/2001 | Feldman | 359/399 |
| 6,226,349 B1 * | 5/2001 | Schuster et al. | 378/84 |
| 2002/0021782 A1 * | 2/2002 | McDonald | 378/84 |
| 2003/0108152 A1 | 6/2003 | Bowen et al. | |

FOREIGN PATENT DOCUMENTS

EP        0 354 605        2/1990

OTHER PUBLICATIONS

Sarfati "Lobster eyes —Brilliant Geometric Design"; Creation 23(3): 12–13, Jun. 2001.*
Irving, et al. "Optical meteorology for analysis of lobster–eye optics"; Applied Optics,Col. 42, No. 13, May 2003.*
Nova Scientific "X–Ray and UUV Optics" publicaiton, www.novascientific.com/xray.html.*
Manners "Lobster eye telescopes" publication; http:/harris-.roe.ac.uk/~jcm/thesis/node45.html; May 25, 2002.*
Petre, Rob, "Physics of X–ray Imaging", Jul. 24, 2002, 1 page.
Peele, A. G., "Instrumentation for a Next–Generation X–Ray All–Sky Monitor", Laboratory for High Energy Astrophysics, Goddard Space Flight Center, Greenbelt, MD 20771, pp. 1–8.

* cited by examiner

Primary Examiner—Frank G. Font
Assistant Examiner—James P. Hughes
(74) Attorney, Agent, or Firm—Burns, Doane, Swecker & Mathis, L.L.P.

(57) ABSTRACT

The invention provides a miniaturized multi-foil object for use in a laboratory environment and other practical applications that require small or portable and/or disposable high energy radiation optics. Specifically, the invention finds utility in high energy lithographic systems, such as X-ray or EUV lithography, as a condenser optic or in topographic systems. In lithographic systems, the present invention exhibits square symmetry, a relatively large aperture size, and disposability. Additionally, the multi-foil optic of the invention provides a high throughput efficiency.

20 Claims, 2 Drawing Sheets

MULTI-FOIL OPTIC

This disclosure claims priority under 35 U.S.C. 119(e) from U.S. Provisional Application No. 60/398,599, filed Jul. 26, 2002, the content of which is incorporated herein by reference.

FIELD OF THE INVENTION

The present invention relates to imaging of high energy radiation, such as X-rays. More particularly, the present invention relates to a multi-foil optic device for use in high energy radiation laboratory applications.

BACKGROUND OF THE INVENTION

X-rays and other high energy radiation, such as extreme ultraviolet (EUV) radiation behave differently from other forms of electromagnetic radiation such as visible light. For example, containment of X-ray radiation and/or focusing of this and other types of high energy radiation is much more difficult than with visible light. Special considerations must be taken into account in applications utilizing X-ray and other types of high energy radiation. For example, X-ray imaging systems are particularly difficult to design because of the way in which X-rays interact with matter.

Generally speaking, X-rays that impinge at a normal angle of incidence on any material are largely absorbed rather than reflected. Therefore, normal incidence mirrors used for optical imaging systems, associated with visible wavelengths, are not useful for X-ray imaging systems. Any refracting imaging system, such as standard optical imaging systems using lenses, which has elements sufficiently thin to transmit X-rays, have extremely long focal lengths, which are not practical for laboratory applications.

Many materials have an index of refraction (n) that is less than 1 at X-ray wavelengths. For example, the index of refraction at X-ray wavelengths for many materials may be expressed as a complex number as defined by Equation 1 below:

$$n = 1 - d - ib \qquad (1)$$

where d represents absorption of the material and b represents the phase shift of the material, both dependent on the wavelength of the incident X-rays. Thus, as can be seen with reference to Equation 1 above, if d is greater than 0 and b is approximately 0, then the index of refraction (n) is less than 1. Because of this property, it is possible for an X-ray, which is traveling in a medium having an index of refraction of unity (i.e., n=1) such as a vacuum, to undergo "total external reflection," for certain angles of incidence. Total external reflection is analogous to "total internal reflection" commonly associated with visible wavelengths of light and governed by Snell's law.

For X-rays to undergo total external reflection, when traveling from a vacuum having an index of refraction of 1, to a material for which the index of refraction is less than 1, certain conditions must be met. These conditions are defined by Snell's law, which states that X-rays will undergo total external reflections for angles θ, where:

$$\theta < \theta_c \qquad (2)$$

and where:

$$\cos(\theta_c) = 1 - d \qquad (3)$$

where d is the material parameter associated with the index of refraction at X-ray wavelengths of the material upon which the X-ray is incident, and $\theta_c$ is the critical angle for total external reflection. The critical angle may also be approximated by Equation 4 below:

$$\theta_c \approx \sqrt{2d} \qquad (4)$$

The parameter d of the index of refraction (n) is proportional to the atomic number (Z). Thus, the critical angle $\theta_c$ is also essentially proportional to the atomic number of the material upon which the X-rays are incident. Therefore, materials having high atomic numbers reflect X-rays more efficiently than materials having low atomic numbers (i.e., the critical angle $\theta_c$ is larger for materials with a higher atomic number Z). For example, gold and nickel are commonly used as reflecting materials for X-rays. The critical angle $\theta_c$ for X-rays incident upon these elements, where the X-rays have an energy of approximately 1 keV, is about 1°. Therefore, according to Equations 2 and 3 above (and based on Snell's law), X-rays having an energy level of 1 keV would experience total external reflection as long as they were incident at an angle less than about 1°. Therefore, from the above, it can be seen that any system used to reflect X-rays would necessarily make use of small angles of incidence between the X-rays and the reflecting material.

Many advances in X-ray optics have come in the field of astronomy. Astronomers have used various techniques to image X-ray radiation from astronomical sources using large telescopes. For example, one method of focusing X-rays in astronomical telescopes has been proposed, which utilizes a set of non-parallel flat metal foils set at correct angles to focus incident X-ray radiation for proper imaging. One particular type of such X-ray imaging is known as "lobster-eye" optics, named after the construction of a lobster's eye, as found in nature. An in-depth discussion of lobster-eye optics can be found in *Instrumentation for a Next-Generation X-Ray All-Sky Monitor*; A. G. Peele, Code 662, available from the Laboratory for High Energy Astrophysics at the Goddard Space Flight Center in Greenbelt, Md.

X-ray optics used in astronomical devices, such as telescopes, are typically large assemblies, usually on the order of about 300 mm$^3$. Such large optic devices serve to collect the maximum possible radiation from weak, distant sources. While such large devices are ideal for use in space with astronomical applications, as they can be easily maneuvered there, they are cumbersome and difficult to use in any type of earth-bound laboratory applications. However, the abilities of such devices could be useful in laboratory applications.

Therefore, it would be desirable to create a miniaturized version of such collector optics for X-rays and other high energy radiation for use in laboratory applications. These laboratory-sized, miniature collector optics should exhibit similar performance advantages to their larger astronomical cousins, but without the cumbersome size generally associated with larger optics.

SUMMARY OF THE INVENTION

Accordingly, the present invention achieves the foregoing objectives by way of a multi-foil optic configured for use in laboratory applications. The multi-foil optic of the present invention overcomes difficulties associated with creating such optics on a miniature scale. Specifically, by way of controlled spacing and positioning of the multi-foil optic of the present invention, applications requiring focusing of X-rays or other high energy radiation in a laboratory environment can be supported.

In accordance with an embodiment, the present invention provides an efficient collector optic that can be used as a first optic in a system for X-ray or EUV lithography. The multi-foil optic of the present invention advantageously provides a large optical aperture and high efficiencies, both of which are desirable in laboratory applications such as lithography. Additionally, the multi-foil optic of the present invention exhibits a square symmetry, which is advantageous for lithography and other applications.

The foregoing features of the invention, and the advantages achieved thereby, are explained in greater detail hereinafter with reference to particular embodiments illustrated in the accompanying drawings.

DETAILED DESCRIPTION OF THE INVENTION

To facilitate an understanding of the principles that underlie the present invention, it will be described hereinafter with particular reference to its implementation in connection with X-ray lithography. It will be appreciated, however, that the practical applications of the invention are not limited to this particular embodiment. Rather, the invention will find utility in a variety of different applications in which efficient X-ray or other high-energy optics for use in laboratory environments are required.

Figure 1:
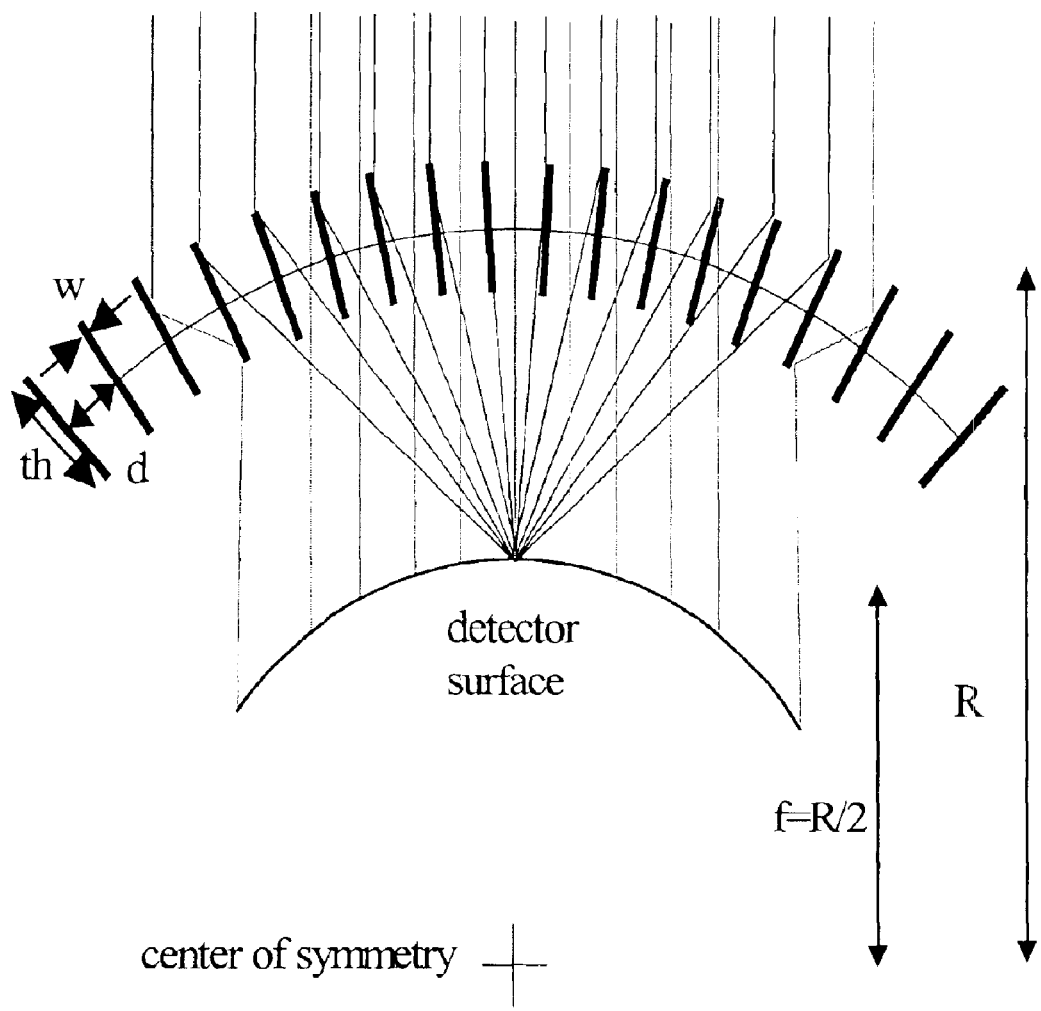
FIG. 1 is a schematic diagram of a lobster-eye multi-foil optic in accordance with an embodiment of the present invention.

FIG. 1 illustrates a basic lobster-eye optic system for focusing X-ray radiation. The lobster-eye array of mirrors, which are normal to the arc of a first outer circle, focus X-ray radiation to a point on a detector surface, shown as an arc of a second inner circle, which is concentric with the first circle. Only one dimension of the lobster-eye optic is shown in FIG. 1. However, those skilled in the art will recognize that the lobster-eye optic may preferably be adapted as a two-dimensional optic device. This type of X-ray optic is based on the total external reflection of X-rays incident at angles smaller than the critical angle $\theta_c$ from flat surfaces. An example of a lobster-eye optic, which forms a part of an X-ray topography system, can be seen in commonly assigned U.S. patent application Ser. No. 10/004,785 to Bowen et al., filed on Dec. 7, 2001, which is entitled, "X-Ray Topographic System."

While such lobster-eye optics have been proposed for use in astronomical telescopes, these optics are typically large assemblies of about 300 mm$^3$. Such large optics are easily used and maneuvered in a cosmic environment, but are difficult to use with any laboratory applications or in a terrestrial laboratory environment.

According to an embodiment of the present invention, however, a miniature version of such a lobster-eye optic, having a size of about 5 mm$^3$ is provided. In accordance with the present invention, the individual mirrors comprise thin foils that have suitable X-ray reflective properties. It is, of course, possible to use metal foils made from appropriate materials, such as gold or nickel. However, if such foils are thin enough to provide acceptable transmission efficiency, they may not possess sufficient rigidity to provide the requisite results. For example, they are susceptible to bending or crumpling, which results in improper focusing of the X-rays. For instance, roughness of the foils that form the reflecting surfaces, in accordance with an embodiment of the present invention, is preferably 3 Angstroms or less. Waviness of the foils should also be low, with a slope error of less than 0.05° for lithographic applications and less than 0.002° for crystal optics.

More preferably, therefore, the foils comprise plates that are made from a low-density material, such as glass or mica, which can be formed into thin sheets that exhibit the requisite degree of stiffness. For instance, each plate might have a thickness of about 50–70 µm. To enhance reflectivity of the X-rays, each plate can be coated with a layer of suitable material, e.g. a highly polished metal, if desired.

All measurements, spacings, and manufacturing qualities of the plates are monitored and maintained within a small margin of error, to enable a multi-foil optic on such a small scale to work properly. Due to the relatively small critical angle $\theta_c$, placement precision of the optical reflecting elements should be controlled to within less than 1°. For example, in accordance with an embodiment of the present invention, placement of the reflective elements is controlled to within about 0.01° for lithographic applications. For crystal optic applications, in accordance with embodiments of the present invention, placement of the reflective elements is controlled to within about 0.002°. For this purpose, the plates that form the X-ray mirrors are oriented and aligned with the use of precision positioning equipment. Once they have been properly positioned relative to one another, the plates are bonded together using a suitable agent, such as epoxy.

Advantageously, a multi-foil optic, according to embodiments of the present invention, has multiple uses in laboratory applications, which to this point have yet to be explored because no multi-foil optic of a convenient size for laboratory applications has been developed. However, the multi-foil optic of the present invention provides an efficient collector optic that can be used as the first optic in a system for high energy radiation lithography, such as EUV or X-ray lithography. This is partly because the multi-foil optic of the invention provides a large aperture and high throughput efficiencies. Additionally, such a miniature multi-foil optic is advantageous as it does not require uniformity of the reflecting surface over such a large length, as would be necessary, for example, in an astronomical telescope or other device having large reflecting surfaces.

Figure 2:
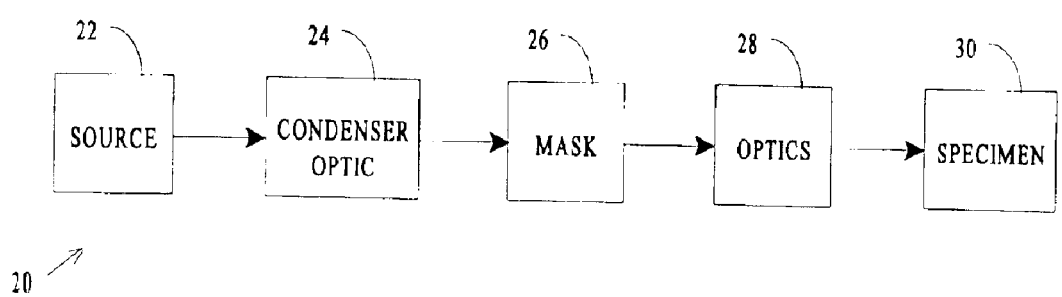
FIG. 2 is a block diagram of a lithographic system in which the present invention can be utilized.

FIG. 2 illustrates a block diagram of a basic high energy radiation lithographic system 20 in which the multi-foil optic of present invention can be used. In FIG. 2, a source 22 provides a beam of energy that is focused by a condenser optic 24 onto a lithographic mask 26. The mask 26 defines a pattern that is to be reproduced on a specimen, such as a semiconductor wafer, for example. Energy transmitted through the mask 26 is focused by a second set of optics 28 onto the specimen 30 to create the desired pattern thereon. High energy radiation or X-ray lithography is desirable in general as it decreases the feature size that can be imprinted on a particular specimen 30. Therefore, on a semiconductor wafer for example, many more transistors can be imprinted using X-ray lithography than would be possible with traditional lithographic systems, which results in more compact electronic devices.

In FIG. 2, the condenser optic 24 could be replaced by a hybrid optic comprising the multi-foil optic of the present invention and another optic for further tailoring the beam (e.g., a polycapillary optic, etc.). By utilizing the multi-foil optic of the present invention in a lithographic system, such as the system shown in FIG. 2, several advantages are achieved. First, the aperture of the multi-foil optic of the present invention is larger than apertures traditionally used in such systems. For example, traditional systems are able to achieve aperture sizes of approximately 20 mm×20 mm, while the present invention is able to provide aperture sizes of about 20 mm×20 mm.

Additionally, the multi-foil optic of the present invention exhibits a naturally square symmetry. A square symmetry is advantageous in lithography, as both masks and specimens often have square geometries, and the multi-foil optic is better adapted to imaging in such a system. Moreover, the angular range of the multi-foil optic of the present invention can be easily extended by using multilayer coatings on each plate.

Another advantage of utilizing the present invention in a high energy lithographic system, such as the system shown in FIG. 2, is that it avoids problems associated with contaminated condenser optics. Condenser optics are usually expensive, and therefore, the present invention has the advantage of being disposable. For example, in X-ray lithography, X-ray sources, such as the source 22 shown in FIG. 2, are generally dirty sources that contaminate the condenser optics 24. For example, a source may comprise lasers hitting and vaporizing a metal foil, such as a copper foil, to create a plasma of multiply charged ions. It is these ions that generate the X-rays used in the system. This process of vaporization creates sputtering that contaminates the condenser optic 24 of a high energy lithographic system. Because the multi-foil optic of the present invention is less expensive however, it can be disposed of when it becomes contaminated and replaced by another multi-foil optic.

A further advantage of the multi-foil optic of the present invention is a high throughput efficiency for the high energy radiation being used. For example, in a high energy lithographic system, such as the one shown in FIG. 2, for example, the multi-foil optic of the present invention provides higher throughput efficiencies than most traditional condenser optics 24 used in such systems. Conventional ellipsoids of revolution, for example, give an annular beam with a hole in the center, which is very inconvenient for many applications. Polycapillary optics avoid the beam problems associated with the ellipsoids of revolution, but lose efficiency at larger sizes, and have a maximum semi-angle of only 6°. The multi-foil optic of the present invention provides a throughput efficiency greater than those associated with both ellipsoids of revolution and polycapillary optics, and should be able to at least double the maximum semi-angle (i.e., the angular aperture) associated with polycapillary devices, while achieving at least three times the transmission efficiency of such a device.

From the foregoing, it can be seen that the present invention provides a multi-foil optic that is convenient for use in laboratory applications requiring focusing of high energy radiation, such as X-rays. One such laboratory application in which the multi-foil optic of the present invention can be utilized is that of high energy or X-ray lithography. In such an application, the present invention exhibits superior symmetry, efficiency, and aperture size, and is disposable, preventing need for re-using expensive, contaminated condenser optics.

It will be appreciated by those of ordinary skill in the art that the present invention can be embodied in other specific forms without departing from the spirit or essential characteristics thereof. For instance, while an exemplary embodiment of the invention has been described with reference to X-ray and other high energy lithography, the principles of the invention are applicable to all applications in which it is desirable to have a miniaturized, disposable multi-foil object for focusing X-rays or other high energy radiation.

The presently disclosed embodiments are, therefore, considered in all respects to be illustrative and not restrictive. The scope of the invention is indicated by the appended claims, rather than the foregoing description, and all changes that come within the meaning and range of equivalents thereof are intended to be embraced therein.

What is claimed is:

1. A multi-foil optic comprising:
   a plurality of flat plates each having a reflecting surface, and positioned normal to an arc to provide total external reflection to high energy radiation incident on the plates from a high energy radiation source, to focus the incident high energy radiation on a designated surface, wherein each plate has a thickness in the range of 50–70 $\mu$m.

2. The multi-foil optic of claim 1, wherein the high energy radiation comprises X-ray radiation.

3. The multi-foil optic of claim 1, wherein the high energy radiation comprises extreme ultraviolet (EUV) radiation.

4. The multi-foil optic of claim 1, wherein the plates are made of glass.

5. The multi-foil optic of claim 1, wherein the plates are made of mica.

6. A method for performing high energy radiation lithography, comprising the steps of:
   receiving high energy radiation from a high energy radiation source;
   focusing the high energy radiation from the high energy radiation source using a multi-foil optic, the multi-foil optic comprising a plurality of flat plates each having a reflecting surface, and positioned normal to an arc to provide total external reflection to high energy radiation incident on the plates from a high energy radiation source, to focus the incident high energy radiation on a designated surface, wherein each plate has a thickness in the range of 50–70 $\mu$m; and
   receiving the focused high energy radiation from the multi-foil optic onto a lithographic specimen via a lithographic mask.

7. The method of claim 6, wherein the high energy radiation comprises X-ray radiation.

8. The method of claim 6, wherein the high energy radiation comprises extreme ultraviolet (EUV) radiation.

9. A high energy lithographic system, comprising:
   a high energy source;
   a multi-foil optic for focusing high energy radiation from the high energy source, the multi-foil optic comprising a plurality of flat plates each having a reflecting surface, and positioned normal to an arc to provide total external reflection to high energy radiation incident on the plates from a high energy radiation source, to focus the incident high energy radiation on a designated surface, wherein each plate has a thickness in the range of 50–70 $\mu$m; and
   a mask, which receives focused high energy radiation from the multi-foil optic and selectively blocks some of the radiation to form a pattern on a specimen that is exposed to high energy radiation passing through said mask.

10. The high energy lithographic system of claim 9, wherein the high energy radiation comprises X-ray radiation.

11. The high energy lithographic system of claim 9, wherein the high energy radiation comprises extreme ultraviolet (EUV) radiation.

12. The multi-foil optic of claim 1, further comprising a coating on each of the flat plates.

13. The multi-foil optic of claim 1, further comprising a multilayer coating on each of the flat plates.

14. The multi-foil optic of claim 1, wherein the multi-foil optic has a size within a volume of about 5 mm$^3$.

15. The method of claim 6, wherein the multi-foil optic comprises a coating on each of the flat plates.

16. The method of claim 6, wherein the multi-foil optic comprises a multilayer coating on each of the flat plates.

17. The method of claim 6, wherein the multi-foil optic has a size within a volume of about 5 mm$^3$.

18. The high energy lithographic system of claim 9, wherein the multi-foil optic comprises a coating on each of the flat plates.

19. The high energy lithographic system of claim 9, wherein the multi-foil optic comprises a multilayer coating on each of the flat plates.

20. The high energy lithographic system of claim 9, wherein the multi-foil optic has a size within a volume of about 5 mm$^3$.

* * * * *